United States Patent [19]

Da Fonte, Jr.

[11] 4,306,933

[45] Dec. 22, 1981

[54] TIN/TIN-LEAD STRIPPING SOLUTIONS

[75] Inventor: Bento Da Fonte, Jr., Carson City, Nev.

[73] Assignee: Chemline Industries, Carson City, Nev.

[21] Appl. No.: 120,617

[22] Filed: Feb. 11, 1980

[51] Int. Cl.³ .................................................. C23F 1/00
[52] U.S. Cl. ..................................... 156/644; 156/656; 252/79.3; 252/79.4
[58] Field of Search ................... 252/79.3, 79.4, 142, 252/146, 151; 156/656, 664; 134/3, 41; 75/97 R, 97 A, 103

[56] References Cited

U.S. PATENT DOCUMENTS 3,537,926 11/1970 Fischer ........................ 252/79.3 X
3,677,949 7/1972 Brindisi .............................. 252/79.4
3,990,982 11/1976 Dixon .......................... 252/79.4 X Primary Examiner—William A. Powell
Attorney, Agent, or Firm—Claude A. S. Hamrick

[57] ABSTRACT

An improved tin/tin-lead stripping solution and method of preparing and using same, the solution including one or more compounds containing at least one amino ($NH_2$) group, one carboxylic acid (—COOH) group and optionally a divalent sulfur group selected from the class of compounds known as amino acids or water/acid soluble derivatives thereof, or selected from the class of compounds known as aromatic carboxylic acids or water/acid soluble derivatives thereof, and incorporated in a basic fluoride-hydrogen peroxide tin-lead stripping solution.

17 Claims, No Drawings

TIN/TIN-LEAD STRIPPING SOLUTIONS

BACKGROUND OF THE INVENTION

1. Field of the Invention

The present invention relates generally to printed circuit board technology, and more particularly to the provision and use of new tin or tin-lead stripping solutions to achieve an improved stripping operation.

2. Description of the Prior Art

Chemical treatments utilizing aqueous solutions consisting of a fluoride source, such as hydrofluoric acid, fluoboric acid, ammonium bifluoride, or mixtures thereof, and hydrogen peroxide as an oxidizing agent are commonly used by the printed circuit industry for stripping tin or tin-lead plating resist from printed circuit board taps or the like. However, these aqueous solutions are sufficiently aggressive that after complete stripping of the tin, tin-lead, a significant, undesirable attack on the underlying copper substrate occurs along with excessive discoloration of the copper. The attack on the underlying copper substrate reduces the copper thickness and correspondingly, the current-carrying capacity of the board. Secondly, the excessive discoloration of the copper requires additional cleaning pretreatment prior to plating of the circuit board tabs with nickel, tin-nickel, gold, or rhodium. Without this additional surface cleaning, poor adhesion of the subsequent plated metals can occur.

There are many methods known to improve the copper substrate appearance, however, these methods require steps which are an addition to, or at least, a continuation of the basic tin/tin-lead stripping process. Improvements in the performance of the basic fluoride-peroxide tin/tin-lead stripping process which result in a reduction in the usual discoloration and attack on underlying copper substrates have thus long been desired.

SUMMARY OF THE INVENTION

It is therefore a primary objective of the present invention to provide new chemical compounds for incorporation in a basic fluoride-hydrogen peroxide tin/tin-lead stripping solution which substantially reduces the discoloration and rate of attack on underlying copper substrates while not inhibiting the stripping of the tin-lead alloy deposits and which may be used on a wide variety of printed circuit boards or the like.

In accordance with a preferred embodiment of the present invention, one or more compounds, containing at least one amino ($NH_2$) group, one carboxylic acid (—COOH) group, and optionally a divalent sulfur group, is selected from the class of compounds known as amino acids or water/acid soluble derivatives thereof; or is selected from the class of compounds known as aromatic carboxylic acids or water/acid soluble derivatives thereof, and are incorporated in basic fluoride-hydrogen peroxide tin-lead stripping solutions. When the stripping solution, containing one or more of the new compounds selected from either or both classes of compounds of the present invention, is used to strip tin or tin-lead alloy plating/immersion deposits from printed circuit boards, the added compound(s) function to reduce the rate of attack on the underlying copper substrate without inhibiting the rate of stripping of the tin, tin-lead deposits. Secondly, the added compound(s) function to prevent discoloration and preserve the copper finish after tin, tin-lead stripping has been completed.

Also, in accordance with a preferred embodiment of the present invention, the stripping compositions, containing one or more new compounds from either or both classes, are normally utilized within a temperature range from 55° F. to 85° F.; however, they may also be operated at elevated temperatures up to 145° F. by the incorporation of suitable hydrogen peroxide stabilizers. The hydrogen peroxide stabilizers may also be incorporated in the stripping compositions for room temperature operation to minimize hydrogen peroxide decomposition during shutdown periods.

An advantage of the present invention is that it improves the stripping process in that after complete stripping of the tin/tin-lead alloy, the copper substrate is left with a lustrous finish comparable to the copper finish prior to tin-lead plating and therefore provides an important reduction in the otherwise required additional copper substrate treatment.

Another advantage of the present invention is that by reducing the rate of attack on underlying copper substrates, the useful life of the device undergoing the tin/tin-lead stripping process is extended.

These and other objects and advantages of the present invention will no doubt become apparent to those of ordinary skill in the art after having read the following description of several preferred embodiments.

DETAILED DESCRIPTION OF THE PREFERRED EMBODIMENT

In accordance with the present invention, one or more new compounds are added to basic fluoride-hydrogen peroxide stripping solutions to improve the performance of the basic stripping process used to strip tin or tin-lead plating resist from printed circuit board tabs.

The fluoride portion of the basic stripping solution includes hydrofluoric acid and/or one or more of its water/acid soluble salts (such as ammonium bifluoride), fluoboric acid and/or one or more of its water/acid soluble salts, or mixtures thereof. The fluoride concentrations found to be useful in accordance with the present invention are from 70 grams/liter to 330 grams/liter with the preferred concentration being in the range of from 90 grams/liter to 160 grams/liter.

The hydrogen peroxide concentrations of the basic stripping solution range from 20 grams/liter to 100 grams/liter of actual hydrogen peroxide with the preferred concentration being in the range from 35 grams/liter to 60 grams/liter of actual hydrogen peroxide. The hydrogen peroxide can be conveniently supplied by using DuPont's hydrogen peroxide solutions such as Albone 35 (0.397 $gH_2O_2$/ml.) and Albone 50 (0.598 $gH_2O_2$/ml.).

The first group of new compounds of the present invention contain at least one amino ($NH_2$) and one carboxylic acid (—COOH) group, and optionally a divalent sulfur group, and are selected from the class of compounds known as amino acids. These compounds may be used within a concentration range of from 0.05 grams/liter up to 100 grams/liter, depending upon the selected amino acid, with the preferred concentration being in the concentration range from 4 grams/liter to 20 grams/liter depending on the selected amino acid(s).

The second group of water/acid soluble compounds in accordance with the present invention is selected from the group of aromatic carboxylic acids, or their water/acid soluble salts, having the general formula:

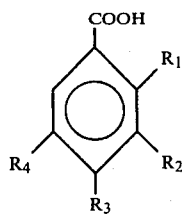

where
R₁, R₂, R₃=H, OH, NH₂, COOH
R₄=H, SO₃H

These compounds may be used in a concentration range of from 0.01 gram/liter up to their limit of solubility in the stripping solution. The preferred concentration is from 0.5 gram/liter to 4.0 grams/liter.

When compound(s) selected from either or both of these classes of compounds is added to the basic fluoride-hydrogen peroxide tin or tin-lead stripping solution, a stripping solution is produced which when used to strip tin or tin-lead from printed circuit board tabs gave the following desirable results:

1. The new compounds did not inhibit the rate of stripping of the tin, or tin-lead plating resist from the printed circuit board tabs;

2. The new compounds significantly reduced the rate of detrimental attack on the underlying copper substrate; and 3. After complete stripping of the tin, tin-lead plating resist, the new compounds left the underlying copper substrate with a bright finish comparable to the copper finish prior to tin, tin-lead plating.

Additionally, in accordance with the present invention the tin/tin-lead stripping solutions containing the new compounds may be utilized within a temperature range from 55° F–145° F., provided compatible hydrogen peroxide stabilizers are incorporated when operating the stripping process at elevated temperatures. The stabilizers may also be incorporated when operating the process at room temperature. Hydrogen peroxide stabilizers found to be suitable for use in the tin-lead stripping compositions of this invention include the following:

1. Organic aliphatic acids selected from the group of organic acids having the general formula:

$CH_3-(CH_2)_n-COOH$ where $n=0-4$.

These may be utilized within a concentration range from 0.05 gram/liter to 50 grams/liter;

2. Polyethylene glycols selected from the group of polyethylene glycols having the general formula:

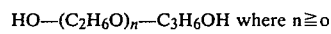
$HO-(C_2H_6O)_n-C_3H_6OH$ where $n \geq 0$ with the preferred compounds having a molecular weight up to 400. These may be utilized within a concentration range from 0.01 gram/liter to 60 grams/liter; and 3. Polypropylene glycols selected from the group of polypropylene glycols having the general formula:

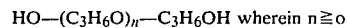
$HO-(C_3H_6O)_n-C_3H_6OH$ wherein $n \geq 0$ with the preferred compounds having a molecular weight up to 400. These may be utilized within a concentration range from 0.01 gram/liter to 60 grams/liter.

In order to contrast the present invention to the prior art, the following examples are given:

EXAMPLE 1 (Prior Art)

A basic tin-lead stripping solution was prepared using 280 grams of ammonium bifluoride and 100 milliliters of hydrogen peroxide (37%). The total volume of this solution is equal to 1.0 liter. One hundred milliliters of this solution was placed in a polyethylene container. A 4.29 gram total weight solution of a tin-lead plated printed circuit board with a tin-lead plating thickness of approximately 300 microinches was immersed in the stripping solution until all the tin-lead had been stripped. The elapsed time was 2 minutes and 5 seconds. The stripped panel was then dried and weighed. The weight loss due to the tin-lead stripping was 0.17 gram.

The printed circuit board was then immersed in the stripping solution for an additional 10 minutes to determine the rate of attack on the copper substrate as well as to determine if discoloration of the copper occurred. After the 10 minute immersion, the board was rinsed, dried, and weighed again. The loss in weight due to attack on the copper was found to be 0.18 gram and the copper had a dark, discolored appearance.

EXAMPLE 2

One hundred milliliters of the above-described basic tin-lead stripping solution was placed in a polyethylene container and a 1.0 gram quantity of the amino acid glycine was dissolved therein. A 4.3 gram section of printed circuit board cut from the same panel used in Example 1, was then immersed in the solution. Complete stripping of the tin-lead plating occurred within 2.0 minutes and the weight loss was found to be 0.165 gram.

The panel was then again immersed in the solution for 10 minutes as in Example 1 above, removed, rinsed, dried and re-weighed. The further weight loss due to attack on the copper substrate was found to be only 0.05 gram. This weight loss was significantly less than the 0.18 gram weight loss experienced using the basic solution without the addition of the glycine.

Additionally, unlike in Example 1, the appearance of the copper was bright and not discolored, and had a finish comparable to the copper finish comparable to the copper finish prior to the tin-lead deposition.

EXAMPLE 3

One hundred milliliters of the above-described basic tin-lead stripping solution was placed in a polyethylene container and a 0.4 gram quantity of the aromatic carboxylic acid known as salicylic acid was dissolved in the basic solution. Using a like procedure as outlined in Example 1 and a like section of the tin-lead plated printed circuit board, complete stripping of the tin-lead plating occurred in 1 minute and 45 seconds. The tin-lead weight loss was found to be 0.19 gram. Thereafter the printed circuit board was again immersed in the stripping solution for an additional 10 minutes after which the additional weight loss was found to be only 0.020 gram. This weight loss evidenced a rate of attack on the copper which was significantly less than the rate of attack experienced using the basic solution as in Example 1.

Additionally, unlike Example 1, the copper appearance was bright and not discolored and had a finish comparable to that prior to the tin-lead plating.

From the results shown in Examples 2 and 3 above, it can readily be seen that stripping solutions prepared in accordance with the present invention offer substantial advantages as compared to the prior art tin-lead stripping solutions.

Although the present invention is disclosed in terms of certain preferred embodiments, it is to be understood that the appended claims are to be interpreted as covering all combinations of the disclosed constituents and other equivalents which fall within the true spirit and scope of the invention.

What is claimed is:

1. An improved tin/tin-lead stripping solution comprising:
   about 280 grams of ammonium bifluoride;
   about 100 milliliters of 35% by weight hydrogen peroxide; and
   about 1.0 gram of the amino acid glycine.

2. An improved tin/tin-lead stripping solution comprising:
   about 280 grams of ammonium bifluoride;
   about 100 milliliters of 35% by weight hydrogen peroxide;
   about 1.0 grams of the amino acid glycine; and
   about 0.4 gram of the aromatic carboxylic acid known as salicylic acid.

3. A method of stripping tin or tin-lead plating from a copper substrate comprising:
   preparing a solution containing about 280 grams ammonium bifluoride and about 100 milliliters of 35% by weight hydrogen peroxide;
   dissolving about 1.0 gram of glycerine in said solution to form a stripping solution; and
   immersing the plated substrate in said stripping solution for a pre-determined period of time.

4. A method of stripping tin or tin-lead plating from a copper substrate comprising:
   preparing a solution containing about 280 grams ammonium bifluoride and about 100 milliliters of 35% by weight hydrogen peroxide;
   dissolving about 0.4 gram of salicylic acid in said solution to form a stripping solution; and
   immersing the plated substrate in said stripping solution for a pre-determined period of time.

5. An acidic aqueous solution for selectively stripping tin or tin-lead solder alloy from a copper substrate comprising:
   a fluoride concentration of about 70–330 grams/liter in which the fluoride is supplied by hydrofluoric acid and/or one or more of its water/acid soluble salts, fluoboric acid and/or one or more of its water/acid soluble salts, or mixtures thereof;
   a hydrogen peroxide concentration of about 20–100 grams/liter actual hydrogen peroxide; and
   about 0.05–100 grams/liter of an amino acid compound, containing at least one amino group ($NH_2$), one carboxylic acid group (—COOH), and/or about 0.01 gram up to the limit of solubility of an aromatic carboxylic acid having the general formula:

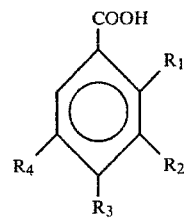

where
$R_1$, $R_2$, $R_3$, =H, OH, $NH_2$, COOH
$R_{4'}$=H, $SO_3H$

6. An acidic aqueous solution as recited in claim 5 wherein the amino acid compound contains only one amino ($NH_2$) group and one carboxylic acid group.

7. An acidic aqueous solution as recited in claim 6 wherein the selected amino acid is glycine.

8. An acidic aqueous solution as recited in claim 5 wherein the amino acid contains at least one amino group ($NH_2$), one carboxylic acid group, and a divalent sulfur group.

9. An acidic aqueous solution as recited in claim 8 wherein the selected amino acid is cysteine.

10. An acidic aqueous solution as recited in claim 5 wherein the aromatic carboxylic acid is ether benzoic acid, salicylic acid, or a mixture thereof.

11. An acidic aqueous solution as recited in claim 5 wherein the aromatic carboxylic acid contains a sulfonic acid group.

12. An acidic aqueous solution as recited in claim 11 wherein the aromatic carboxylic acid is 5-sulfosalicylic acid.

13. An acidic aqueous solution as recited in claim 5 wherein the solution is operated within a temperature range of 55° F.–145° F.

14. An acidic aqueous solution as recited in claim 13 wherein the solution contains a compatible hydrogen peroxide stabilizer.

15. An acidic aqueous solution as recited in claim 14 wherein the solution contains about 0.01–60 grams/liter of the hydrogen peroxide stabilizer having the general formula:

$$CH_3-(CH_2)_n-COOH \text{ where } n=0-4.$$

16. An acidic aqueous solution as recited in claim 14 wherein the solution contains about 0.01–60 grams/liter of a hydrogen peroxide stabilizer which is selected from the group known as polyethylene glycols having the general formula:

$$HO-(C_2H_O)_n-C_2H_2-OH \text{ where } n \geq o.$$

17. An acidic aqueous solution as recited in claim 14 wherein the solution contains about 0.01–60 grams/liter of a hydrogen peroxide stabilizer which is selected from the group of compounds known as polypropylene glycols having the general formula:

$$HO-(C_3H_6O)_n-C_3H_6OH \text{ where } n \geq o.$$

* * * * *